(12) United States Patent
Wang et al.

(10) Patent No.: US 10,746,791 B2
(45) Date of Patent: Aug. 18, 2020

(54) GLITCH MEASUREMENT DEVICE AND GLITCH MEASUREMENT METHOD

(71) Applicants: GLOBAL UNICHIP CORPORATION, Hsinchu (TW); TAIWAN SEMICONDUCTOR MANUFACTURING CO., LTD., Hsinchu (TW)

(72) Inventors: Ting-Hao Wang, Hsinchu (TW); Po-Chen Lee, Hsinchu (TW)

(73) Assignees: GLOBAL UNICHIP CORPORATION, Hsinchu (TW); TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 32 days.

(21) Appl. No.: 16/215,596

(22) Filed: Dec. 10, 2018

(65) Prior Publication Data

US 2020/0033406 A1 Jan. 30, 2020

(30) Foreign Application Priority Data

Jul. 27, 2018 (TW) .............................. 107126227 A

(51) Int. Cl.
| | |
|---|---|
| *G01R 31/317* | (2006.01) |
| *H03K 21/38* | (2006.01) |
| *G01R 31/3177* | (2006.01) |
| *H03K 5/14* | (2014.01) |
| *H03K 5/00* | (2006.01) |
| *H03K 19/21* | (2006.01) |

(52) U.S. Cl.
CPC ... *G01R 31/31703* (2013.01); *G01R 31/3177* (2013.01); *H03K 5/14* (2013.01); *H03K 21/38* (2013.01); *H03K 19/21* (2013.01); *H03K 2005/00013* (2013.01)

(58) Field of Classification Search
CPC .......... G01R 31/31703; G01R 31/3177; H03K 21/38; H03K 5/14; H03K 2005/00013; H03K 19/21
See application file for complete search history.

(56) References Cited

U.S. PATENT DOCUMENTS 5,245,311 A * 9/1993 Honma ............ G01R 31/31937
340/146.2
2008/0309542 A1* 12/2008 Tanizawa .............. H03M 1/089
341/163

(Continued)

*Primary Examiner* — Thien Nguyen
(74) *Attorney, Agent, or Firm* — CKC & Partners Co., LLC

(57) ABSTRACT

A glitch measurement device is coupled to a circuit under-test and includes a counter circuitry and a detector circuitry. The counter circuitry is coupled to the circuit under-test, and is configured to perform a first counting operation according to an input signal transmitted to the circuit under-test to generate a first count signal, and to perform a second counting operation according to an output signal outputted from the circuit under-test to generate a second count signal. The detector circuitry is coupled to the circuit under-test and the counter circuitry, and is configured to receive the first count signal and the second count signal according to the input signal, and to generate a glitch indication signal according to the first count signal and the second count signal.

6 Claims, 4 Drawing Sheets

(56) References Cited

U.S. PATENT DOCUMENTS

| | | | |
|---|---|---|---|
| 2009/0108879 A1* | 4/2009 | Kelkar | G01R 23/005 327/40 |
| 2011/0311017 A1* | 12/2011 | Baumeister | G06F 1/10 377/39 |
| 2011/0317802 A1* | 12/2011 | Rohleder | H03K 5/1252 377/39 |
| 2014/0006841 A1* | 1/2014 | Rohleder | H03K 5/1252 713/502 |
| 2015/0214933 A1 | 7/2015 | Sehgal et al. | |
| 2016/0248414 A1* | 8/2016 | Vilangudipitchai | H03K 17/04206 |

* cited by examiner

GLITCH MEASUREMENT DEVICE AND GLITCH MEASUREMENT METHOD

RELATED APPLICATIONS

This application claims priority to Taiwan Application Serial Number 107126227, filed Jul. 27, 2018, which is herein incorporated by reference in its entirety.

BACKGROUND

Technical Field

The present disclosure relates to a glitch measurement device. More particularly, the present disclosure relates to a glitch measurement device employing a counter circuit and a glitch measurement method thereof.

Description of Related Art

In practical applications, electrical circuits are often affected by noises. These noises may be introduced from various sources. For example, when a delay time expected to be adjusted by a delay line circuit is too much, unnecessary glitch may occur on an output signal of the delay line circuit. As a result, operations of the electrical circuits may be failed or a performance of the electrical circuits may be reduced.

SUMMARY

Some aspects of the present disclosure are to provide a glitch measurement device. The glitch measurement device is coupled to a circuit under-test and includes a counter circuitry and a detector circuitry. The counter circuitry is coupled to the circuit under-test, and is configured to perform a first counting operation according to an input signal transmitted to the circuit under-test to generate a first count signal, and to perform a second counting operation according to an output signal outputted from the circuit under-test to generate a second count signal. The detector circuitry is coupled to the circuit under-test and the counter circuitry, and is configured to receive the first count signal and the second count signal according to the input signal, and to generate a glitch indication signal according to the first count signal and the second count signal.

Some aspects of the present disclosure are to provide a glitch measurement that includes following operations: performing a first counting operation and a second counting operation according to an input signal and an output signal that are associated with a circuit under-test, respectively, in order to generate a first count signal and a second count signal, in which the circuit under-test generates the output signal according to the input signal; and receiving the first count signal and the second count signal according to the input signal, and generating a glitch indication signal according to the first count signal and the second count signal.

As described above, the glitch measurement device and the glitch measurement method provided in embodiments of the present disclosure are able to detect an input signal and an output signal of a circuit under-test (e.g., the delay line circuit), in order to determine whether operations of a circuit under-test introduce a glitch by mistake.

DETAILED DESCRIPTION

The following embodiments are disclosed with accompanying diagrams for detailed description. For illustration clarity, many details of practice are explained in the following descriptions. However, it should be understood that these details of practice do not intend to limit the present disclosure. That is, these details of practice are not necessary in parts of embodiments of the present embodiments. Furthermore, for simplifying the drawings, some of the conventional structures and elements are shown with schematic illustrations.

Although the terms "first," "second," etc., may be used herein to describe various elements, these elements should not be limited by these terms. These terms are used to distinguish one element from another. For example, a first element could be termed a second element, and, similarly, a second element could be termed a first element, without departing from the scope of the embodiments. As used herein, the term "and/or" includes any and all combinations of one or more of the associated listed items.

In this document, the term "coupled" may also be termed as "electrically coupled," and the term "connected" may be termed as "electrically connected." "Coupled" and "connected" may mean "directly coupled" and "directly connected" respectively, or "indirectly coupled" and "indirectly connected" respectively. "Coupled" and "connected" may also be used to indicate that two or more elements cooperate or interact with each other.

In this document, the term "circuitry" may indicate a system formed with one or more circuits. The term "circuit" may indicate an object, which is formed with one or more transistors and/or one or more active/passive elements based on a specific arrangement, for processing signals.

Figure 1:
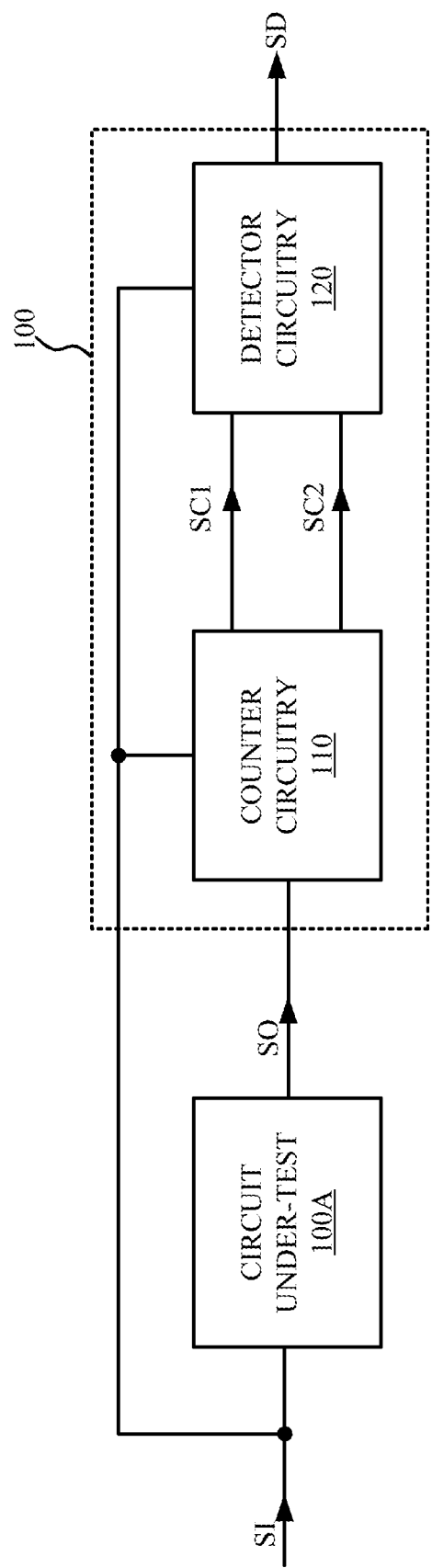
FIG. 1 is a schematic diagram of a glitch measurement device according to some embodiments of the present disclosure.

Reference is now made to FIG. 1. FIG. 1 is a schematic diagram of a glitch measurement device 100 according to some embodiments of the present disclosure. In some embodiments, the glitch measurement device 100 is coupled to a circuit under-test 100A, in order to measure whether a glitch occurs on an output signal SO, in which the output signal SO is generated by the circuit under-test 100A based on the an input signal SI. In different embodiments, the circuit under-test 100A may be various circuits, which may be, for example, a delay line circuit 200A discussed in FIG. 2 below, but the present disclosure is not limited thereto.

In some embodiments, the glitch measurement device 100 includes a counter circuitry 110 and a detector circuitry 120. The counter circuitry 110 is coupled to the circuit under-test 100A, in order to receive the output signal SO and the input signal SI. The counter circuitry 110 is configured to perform a counting operation according to the input signal SI, in order to generate a count signal SC1. The counter circuitry 110 is configured to perform another counting operation according to the output signal SO, in order to generate a count signal SC2.

The detector circuitry 120 is coupled to the circuit under-test 100A and the counter circuitry 110, in order to receive the count signals SC1 and SC2 and the input signal SI. The detector circuitry 120 is configured to receive the count signals SC1 and SC2 according to the input signal SI, and generate a glitch indication signal SD according to the count signals SC1 and SC2, in which the glitch indication signal SD is for indicating that a glitch occurs on the output signal SO.

For example, if a glitch occurs on the output signal SO, the counter signal SC1 is different from the count signal SC2. Under this condition, the detector circuitry 120 may generate the glitch indication signal SD having a corresponding logic value (e.g., the logic value of 1), in order to indicate that the glitch occurs on the output signal SO. Detailed operations regarding herein will be described in the following paragraphs with reference to FIGS. 2-3.

The following paragraphs illustrate implementations of the above circuitries, but the present disclosure is not limited to the following embodiments.

Figure 2:
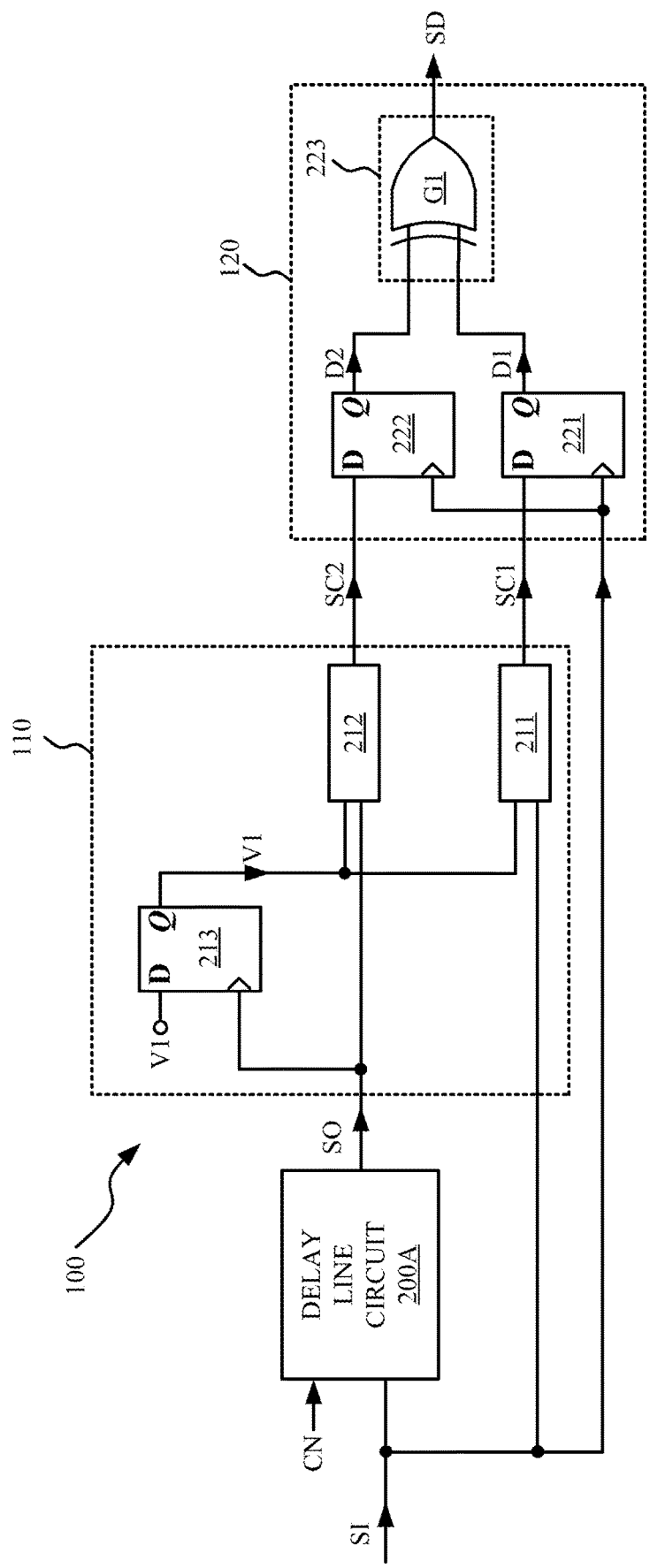
FIG. 2 is a circuit diagram of the glitch measurement device in FIG. 1, according to some embodiments of the present disclosure.

Reference is now made to FIG. 2. FIG. 2 is a circuit diagram of the glitch measurement device 100 in FIG. 1, according to some embodiments of the present disclosure. For ease of understanding, like elements in FIG. 2 are designated with the same reference numbers with respect to FIG. 1.

In this example, the circuit under-test 100A may be the delay line circuit 200A, in which the delay line circuit 200A delays the input signal SI according to a delay control signal CN to generate the output signal SO. In some embodiments, the delay line circuit 200A may be implemented with multiple stages of digital circuits, but the present disclosure is not limited thereto.

In some embodiments, the counter circuitry 110 includes counter circuits 211-212 and a flip-flop 213. The flip-flop 213 is coupled to the output terminal of the delay line circuit 200A to receive the output signal SO. The flip-flop 213 is triggered by the output signal SO to output a voltage V1 to the counter circuits 211-212, in order to reset the counter circuits 211-212. In other words, before performing related counting operations, the counter circuitry 110 (i.e., the counter circuits 211-212) can be reset by the voltage V1 that is associated with the output signal SO. Therefore, incorrect operations, which are caused based on the delay between the input signal SI and the output signal SO, of the counter circuits can be prevented, and thus the detector circuitry 120 is prevented from generating glitch indication signal SD by mistake.

The counter circuit 211 is coupled to the flip-flop 213 and the delay line circuit 200A, in order to receive the voltage V1 and the input signal SI. In some embodiments, the counter circuit 211 is reset by the voltage V1, and then performs the counting operation according to the input signal SI to generate the counter signal SC1. The counter circuit 212 is coupled to the flip-flop 213 and the delay line circuit 200A, in order to receive the voltage V1 and the output signal SO. In some embodiments, the counter circuit 212 is reset by the voltage V1, and then performs a counting operation according to the output signal SO to generate the count signal SC2.

In some embodiments, the counter circuit 211 and the counter circuit 212 may be implemented with positive/negative-edge triggered UP counters. In some embodiments, the counter circuit 211 and the counter circuit 212 may be implemented with positive/negative-edge triggered down counters. In some embodiments, the count signals SC1-SC2 may be multiple-bits signals. The above arrangements of the counter circuits 211 and 212 are given for illustrative purposes. Various arrangements of the counter circuits 211 and 212 are within the contemplated scope of the present disclosure.

In some embodiments, the detector circuitry 120 includes a flip-flop 221, a flip-flop 222, and a comparator circuit 223. The flip-flop 221 is coupled to the delay line circuit 200A and the counter circuit 211, in order to receive the input signal SI and the count signal SC1. In some embodiments, the flip-flop 221 is configured to be triggered by the input signal SI to generate a data value D1 according to the count signal SC1. The flip-flop 222 is coupled to the delay line circuit 200A and the counter circuit 212, in order to receive the input signal SI and the count signal SC2. In some embodiments, the flip-flop 222 is triggered by the input signal SI to generate a data value D2 according to the count signal SC2. In other words, in some embodiments, when being triggered by the input signal SI, the flip-flops 221 and 222 are configured to receive the count signals SC1 and SC2 respectively, in order to generate the data values D1 and D2.

The comparator circuit 223 is coupled to the flip-flops 221 and 222, in order to receive the data values D1 and D2. In some embodiments, the comparator circuit 223 is configured to compare the data value D1 with the data value D2. If the data values D1 and D2 are different, the comparator circuit 223 generates a glitch indication signal SD having the corresponding logic value (e.g., a logic value of 1).

In some embodiments, the comparator circuit 223 may be implemented with an exclusive-OR (XOR) gate circuit G1, but the present disclosure is not limited thereto. Various circuits to perform the same operations of the comparator circuit 223 are within the contemplated scope of the present disclosure.

The above flip-flops 213, 221, and 222 are given with D flip-flops for illustrative purposes, but the present disclosure is not limited thereto. Various types of flip-flops are within the contemplated scope of the present disclosure.

Figure 3:
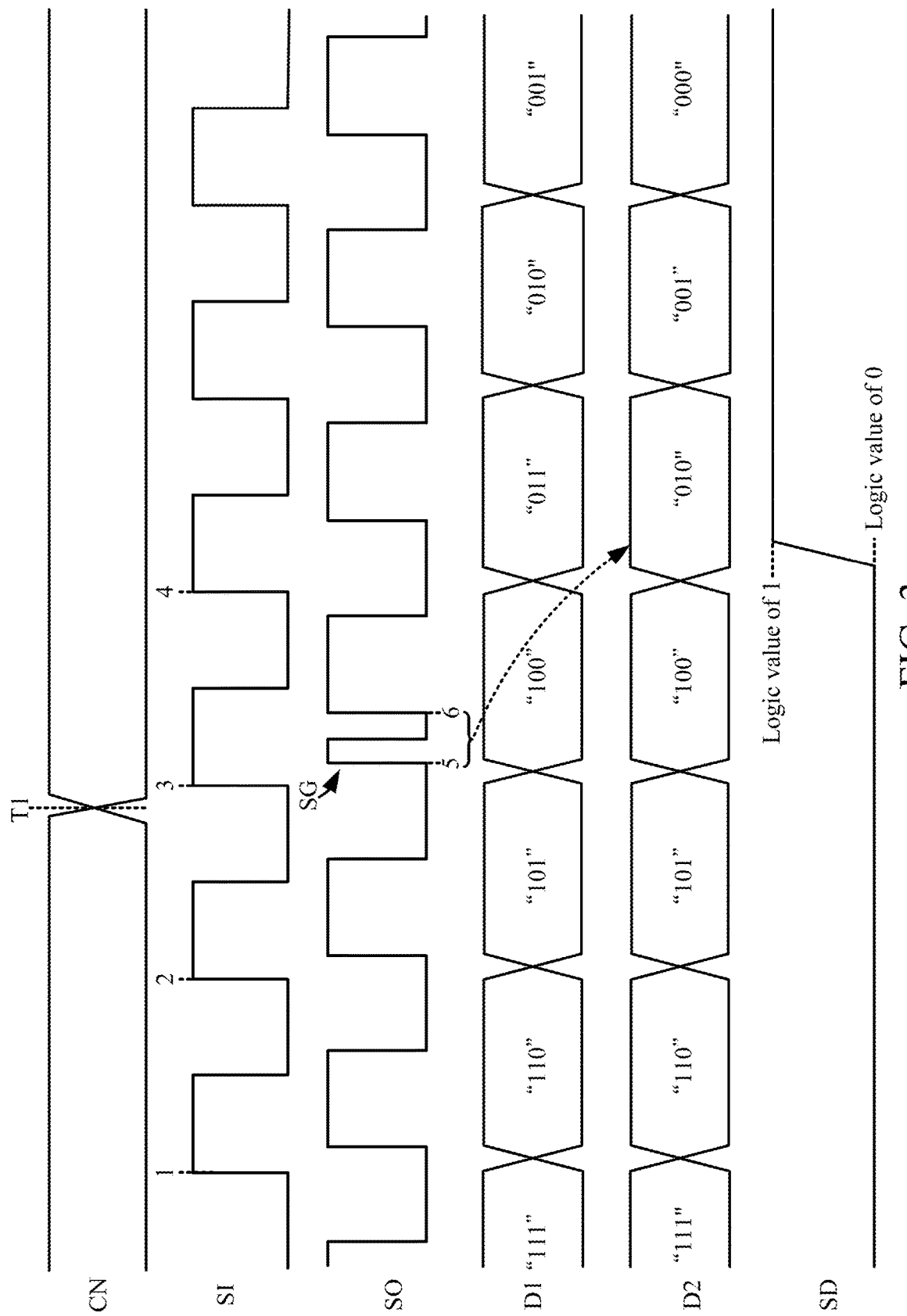
FIG. 3 is a waveform diagram of signals in the glitch measurement device of FIG. 2, according to some embodiments of the present disclosure.

Reference is now made to FIG. 3. FIG. 3 is a waveform diagram of signals in the glitch measurement device 100 of FIG. 2, according to some embodiments of the present disclosure. For ease of understanding, like elements in FIGS. 1-2 are designated with the same reference numbers. FIG. 3 is given with examples of using 3-bit down counter for illustrative purposes, and the present disclosure is not limited thereto.

As shown in FIG. 3, under a normal operation, the counter circuits 211 and 212 are reset according to the voltage V1 to generate the data values D1 and D2 having the same signal values of "111." Then, the counter circuit 211 performs the down-counting operations sequentially according to rising edges 1-3 of the input signal SI. Accordingly, the flip-flop 221 is triggered by the input signal SI to generate the data value D1 having the signal value of "110," "101," and "100" in sequence. Similarly, the counter circuit 212 performs the down-counting operations sequentially according to rising edges of the output signal SO, wherein the output signal SO is the delay signal of the input signal SI. Accordingly, the flip-flop 222 is triggered by the input signal SI to generate the data value D2 having the signal value of "110," "101," and "100" in sequence. Under this condition, the comparator circuit 223 determines that the data value D1 is the same as the data value D2, and thus outputs the glitch indication signal SD having the logic value of 0.

At time T1, the signal value of the delay control signal CN is switched to tune the delay time of the delay line circuit 200A. In certain situations, a glitch SG may occur on the output signal SO by mistake. Thus, prior to a rising edge 4 of the input signal SI, two rising edges 5 and 6 of the output signal SO are generated by mistake. Under this condition, the counter circuit 212 performs twice down-counting operations (i.e., from "100" to "010"). Accordingly, the flip-flop 222 is triggered by the input signal SI to generate the data value D2 having the signal value of "010." Correspondingly, the counter circuit 211 performs one down-counting operations according to the rising edge 4 of the input signal SI (i.e., from "100" down to "011"). Accordingly, the flip-flop 221 is triggered by the input signal SI to generate the data value D1 having the signal value of "011". Under this condition, the comparator circuit 223 determines that the data value D1 (i.e., the signal value of "011") is different from the data value D2 (i.e., the signal value of "010), and thus outputs the glitch indication signal SD having the logic value of 1.

With the above arrangements, whether the operations of the circuit under-test 100A (e.g., the delay line circuit 200A) introduce a glitch can be effectively determined by monitoring the logic value of the glitch indication signal SD. As a result, it is able to check or to revise the circuit under-test 100A efficiently.

Figure 4:
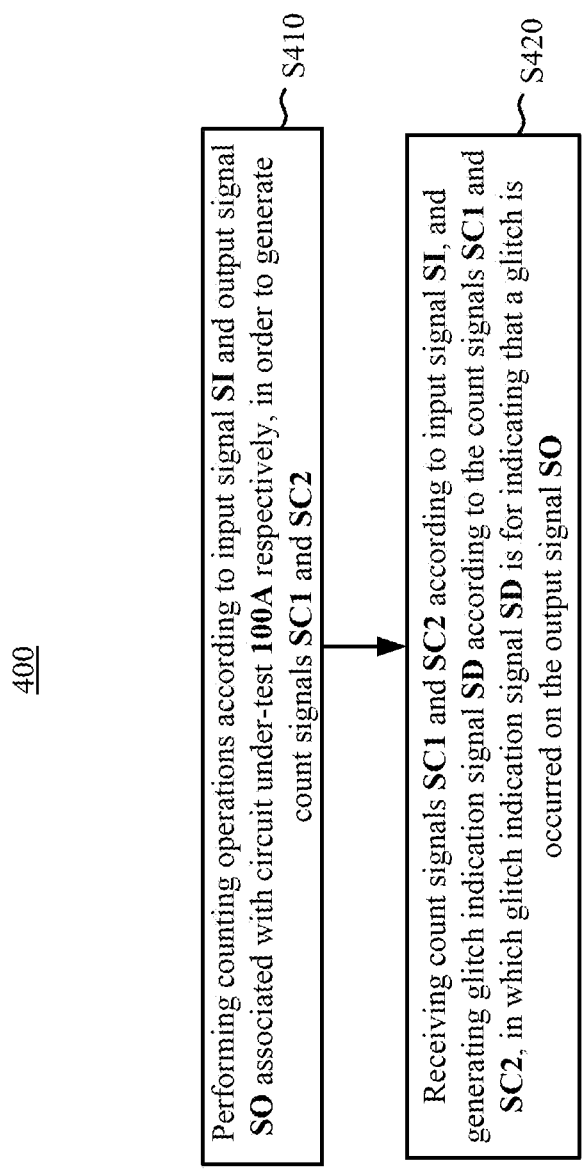
FIG. 4 is a flow chart of a glitch measurement method, according to some embodiments of the present disclosure.

Reference is now made to FIG. 4. FIG. 4 is a flow chart of a glitch measurement method 400, according to some embodiments of the present disclosure. For ease of understanding, the glitch measurement method 400 will be described with reference to the above figures.

In operation S410, counting operations are performed according to the input signal SI and the output signal SO associated with the circuit under-test 100A respectively, in order to generate the count signals SC1 and SC2.

For example, as shown in FIGS. 1-2, the counter circuit 211 may perform the counting operation according to the input signal SI transmitted to the delay line circuit 200A, in order to generate the count signal SC1. The counter circuit 212 may perform another counting operation according to the output signal SO outputted from the delay line circuit 200A, in order to generate the count signal SC2.

In operation S420, the count signals SC1 and SC2 are received according to the input signal SI, and the glitch indication signal SD is generated according to the count signals SC1 and SC2, in which the glitch indication signal SD is for indicating that a glitch is occurred on the output signal SO.

For example, as shown in FIGS. 1-2, the detector circuitry 120 may be triggered by the input signal SI, in order to generate the data values D1 and D2 according to the count signals SC1 and SC2. As shown in FIG. 3, when the data values D1-D2 are different, the detector circuitry 120 outputs the glitch indication signal SD having a corresponding logic value (e.g., the logic value of 1), in order to indicate that a glitch is occurred on the output signal SO.

The above description of the glitch measurement method 400 includes exemplary operations, but the operations of the glitch measurement method 400 are not necessarily performed in the order described above. The order of the operations of the glitch measurement method 400 can be changed, or the operations can be executed simultaneously or partially simultaneously as appropriate, in accordance with the spirit and scope of various embodiments of the present disclosure.

As described above, the glitch measurement device and the glitch measurement method provided in embodiments of the present disclosure are able to detect an input signal and an output signal of a circuit under-test (e.g., the delay line circuit), in order to determine whether operations of a circuit under-test introduce a glitch by mistake.

Various functional components or blocks have been described herein. As will be appreciated by persons skilled in the art, the functional blocks will preferably be implemented through circuits (either dedicated circuits, or general purpose circuits, which operate under the control of one or more processors and coded instructions), which will typically comprise transistors or other circuit elements that are configured in such a way as to control the operation of the circuitry in accordance with the functions and operations described herein. As will be further appreciated, the specific structure or interconnections of the circuit elements will typically be determined by a compiler, such as a register transfer language (RTL) compiler. RTL compilers operate upon scripts that closely resemble assembly language code, to compile the script into a form that is used for the layout or fabrication of the ultimate circuitry. Indeed, RTL is well known for its role and use in the facilitation of the design process of electronic and digital systems.

It will be apparent to those skilled in the art that various modifications and variations can be made to the structure of the present disclosure without departing from the scope or spirit of the disclosure. In view of the foregoing, it is intended that the present disclosure cover modifications and variations of this disclosure provided they fall within the scope of the following claims.

What is claimed is:

1. A glitch measurement device, coupled to a circuit under-test, the glitch measurement device comprising:
a counter circuitry, coupled to the circuit under-test, and comprising:
a first counter circuit configured to be reset by a voltage generated according to an output signal outputted from the circuit under-test, in order to perform a first counting operation according to an input signal transmitted to the circuit under-test to generate a first count signal; and
a second counter circuit configured to be reset by the voltage, in order to perform a second counting operation according to the output signal to generate a second count signal; and
a detector circuitry, coupled to the circuit under-test and the counter circuitry, and comprising:
a first flip-flop configured to be triggered by the input signal, in order to generate a first data value according to the first count signal;
a second flip-flop configured to be triggered by the input signal, in order to generate a second data value according to the second count signal; and
a comparator circuit configured to compare the first data value with the second data value, and to generate a glitch indication signal having a corresponding logic value if the first data value is different from the second data value.

2. The glitch measurement device of claim 1, wherein before the first counting operation and the second counting operation are performed, the counter circuitry is configured to be reset by the output signal.

3. The glitch measurement device of claim 2, wherein the counter circuitry comprises:
a flip-flop configured to be triggered by the output signal to generate the voltage, in order to reset the counter circuitry.

4. The glitch measurement device of claim 1, wherein the comparator circuit is an exclusive OR gate circuit.

5. The glitch measurement device of claim 1, wherein the circuit under-test is a delay line circuit, and the delay line circuit is configured to delay the input signal according to a delay control signal to generate the output signal.

6. A glitch measurement method, comprising:
triggering a flip-flop according to an output signal outputted from a circuit under-test, in order to generate a first voltage;
resetting a first counter circuit according to the first voltage, in order to perform a first counting operation according to an input signal transmitted to the circuit under-test to generate a first count signal;
resetting a second counter circuit according to the first voltage, in order to perform a second counting operation according to the output signal to generate a second count signal;
triggering a first flip-flop according to the input signal, in order to generate a first data value according to the first count signal;
triggering a second flip-flop according to the input signal, in order to generate a second data value according to the second count signal; and
generating a glitch indication signal having a corresponding logic value if the first data value is different from the second data value.

* * * * *